(12) United States Patent
Miyazaki et al.

(10) Patent No.: US 11,623,237 B2
(45) Date of Patent: Apr. 11, 2023

(54) DROPLET EJECTING APPARATUS HAVING CORRECTABLE MOVEMENT MECHANISM FOR WORKPIECE TABLE AND DROPLET EJECTING METHOD

(71) Applicant: Tokyo Electron Limited, Tokyo (JP)

(72) Inventors: Kazuhito Miyazaki, Kumamoto (JP); Akira Kakino, Kumamoto (JP); Wataru Yoshitomi, Kumamoto (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 79 days.

(21) Appl. No.: 15/911,375

(22) Filed: Mar. 5, 2018

(65) Prior Publication Data
US 2018/0257101 A1   Sep. 13, 2018

(30) Foreign Application Priority Data

Mar. 7, 2017   (JP) .............................. JP2017-042752

(51) Int. Cl.
*B05C 11/00*   (2006.01)
*B05D 1/26*   (2006.01)
(Continued)

(52) U.S. Cl.
CPC ............ *B05C 11/00* (2013.01); *B05B 12/084* (2013.01); *B05C 5/0216* (2013.01);
(Continued)

(58) Field of Classification Search
CPC . H01L 21/681; H01L 27/1292; B05C 5/0216; G05B 2219/45235; G05B 19/4141
See application file for complete search history.

(56) References Cited

U.S. PATENT DOCUMENTS 5,030,836 A * 7/1991 Kusui ................. H01J 37/3026
 250/492.3
5,415,693 A * 5/1995 Yoneda ................. B05C 5/0216
 118/664
(Continued)

FOREIGN PATENT DOCUMENTS

CN   101164782 A   4/2008
CN   106311524 A   1/2017
(Continued)

*Primary Examiner* — Karl Kurple
(74) *Attorney, Agent, or Firm* — Venjuris, P.C.

(57) ABSTRACT

Disclosed is droplet ejecting apparatus that ejects droplets of a functional liquid onto a workpiece to draw a pattern. The droplet ejecting apparatus includes: a workpiece table; a droplet ejecting head configured to eject the droplets onto the workpiece placed on the workpiece table; a movement mechanism configured to relatively move the workpiece table and the droplet ejecting head in a main scanning direction and a sub-scanning direction; and a control unit configured to: detect a position of the workpiece or a position of the workpiece table while relatively moving the workpiece table and the droplet ejecting head along a plurality of scanning lines extending in the main scanning direction and set side by side in the sub-scanning direction; and create, based on a detection result, a correction table that indicates a correlation between a position of the movement mechanism and a positional correction amount of the workpiece table.

10 Claims, 9 Drawing Sheets

(51) Int. Cl.
*B41J 11/00* (2006.01)
*B05C 5/02* (2006.01)
*G01B 11/00* (2006.01)
*B41J 11/06* (2006.01)
*B41J 11/42* (2006.01)
*H01L 27/12* (2006.01)
*B41J 29/393* (2006.01)
*H01L 21/67* (2006.01)
*B41J 11/46* (2006.01)
*B05C 11/10* (2006.01)
*B05B 12/08* (2006.01)
*B41J 2/045* (2006.01)
*G06T 3/40* (2006.01)
*B29C 64/393* (2017.01)
*B05C 13/00* (2006.01)
*H01J 9/02* (2006.01)
*H01L 51/00* (2006.01)
*B41J 25/00* (2006.01)
*B41J 11/20* (2006.01)

(52) U.S. Cl.
CPC ...... *B05C 11/1005* (2013.01); *B05C 11/1015* (2013.01); *B05C 13/00* (2013.01); *B05D 1/26* (2013.01); *B29C 64/393* (2017.08); *B41J 2/04505* (2013.01); *B41J 11/0095* (2013.01); *B41J 11/06* (2013.01); *B41J 11/42* (2013.01); *B41J 11/46* (2013.01); *B41J 29/393* (2013.01); *G01B 11/002* (2013.01); *G06T 3/4007* (2013.01); *H01L 21/67259* (2013.01); *H01L 27/1292* (2013.01); *B41J 11/20* (2013.01); *B41J 25/001* (2013.01); *B41J 2029/3935* (2013.01); *B41J 2203/01* (2020.08); *G05B 2219/45235* (2013.01); *H01J 9/02* (2013.01); *H01L 51/0004* (2013.01)

(56) References Cited

U.S. PATENT DOCUMENTS

| | | | | |
|---|---|---|---|---|
| 5,614,024 A * | 3/1997 | Ishida | ............... | B05B 12/084 118/697 |
| 5,932,012 A * | 8/1999 | Ishida | ............... | B05C 5/0212 118/669 |
| 6,023,977 A * | 2/2000 | Langdon | ............... | G01N 29/06 367/87 |
| 6,122,078 A * | 9/2000 | Leberl | ............... | G01C 11/04 358/474 |
| 6,288,745 B1 * | 9/2001 | Okuno | ............... | G06T 3/4007 348/441 |
| 6,288,801 B1 * | 9/2001 | Leberl | ............... | G01C 11/04 358/474 |
| 6,323,964 B1 * | 11/2001 | Yamamoto | ............... | H04N 1/113 358/474 |
| 6,335,508 B1 * | 1/2002 | Nam | ............... | B23D 21/00 219/121.67 |
| 6,390,587 B1 * | 5/2002 | Subirada | ............... | B41J 2/2135 347/19 |
| 6,778,177 B1 * | 8/2004 | Furtner | ............... | G06T 15/50 345/443 |
| 7,160,512 B2 * | 1/2007 | Hirota | ............... | B01J 19/0046 422/64 |
| 7,236,184 B2 * | 6/2007 | Ehara | ............... | G06K 15/02 347/254 |
| 7,548,798 B2 * | 6/2009 | Bang | ............... | B05C 5/0216 222/41 |
| 7,667,194 B2 * | 2/2010 | Noritake | ............... | B01L 3/0268 250/284 |
| 7,673,960 B2 * | 3/2010 | Bastani | ............... | B41J 29/393 347/19 |
| 7,854,488 B2 * | 12/2010 | Yamazaki | ............... | B41J 29/393 347/19 |
| 8,485,624 B2 * | 7/2013 | Mikami | ............... | B41J 2/2135 347/9 |
| 8,855,399 B2 * | 10/2014 | Goren | ............... | G01B 11/14 382/141 |
| 8,970,909 B2 * | 3/2015 | Yamazaki | ............... | H04N 1/4015 358/3.03 |
| 2001/0010916 A1 * | 8/2001 | Schleifer | ............... | B01L 3/0268 435/6.11 |
| 2005/0219644 A1 * | 10/2005 | Ehara | ............... | G06K 15/02 358/474 |
| 2006/0216409 A1 * | 9/2006 | Mishima | ............... | B41J 11/46 427/66 |
| 2007/0070099 A1 * | 3/2007 | Beer | ............... | B41J 2/0456 347/8 |
| 2007/0106418 A1 * | 5/2007 | Hagen | ............... | B29C 70/386 700/186 |
| 2008/0100658 A1 * | 5/2008 | Bastani | ............... | B41J 29/393 347/16 |
| 2008/0136853 A1 * | 6/2008 | Kinoshita | ............... | B41J 2/04506 347/12 |
| 2008/0309703 A1 * | 12/2008 | Yamazaki | ............... | B41J 29/393 347/19 |
| 2009/0021749 A1 * | 1/2009 | Yeo | ............... | G01N 21/9501 356/601 |
| 2010/0156976 A1 * | 6/2010 | Seo | ............... | B41J 2/04586 347/14 |
| 2012/0154826 A1 * | 6/2012 | Yamazaki | ............... | H04N 1/405 358/1.1 |
| 2015/0116735 A1 * | 4/2015 | Howard | ............... | B41J 2/2146 358/1.4 |
| 2016/0125589 A1 * | 5/2016 | Tertitski | ............... | G06T 7/0004 382/151 |
| 2018/0257100 A1 * | 9/2018 | Yoshitomi | ............... | B05C 11/1021 |
| 2018/0257101 A1 * | 9/2018 | Miyazaki | ............... | H01J 9/02 |
| 2018/0261472 A1 * | 9/2018 | Miyazaki | ............... | B41J 2/2135 |
| 2021/0146601 A1 * | 5/2021 | Cao | ............... | B29C 64/393 |

FOREIGN PATENT DOCUMENTS

| | | |
|---|---|---|
| JP | 2010-198028 A | 9/2010 |
| KR | 10-2017-0004866 A | 1/2017 |

* cited by examiner

PULSE INSERTION

PULSE ELIMINATION

PULSE PITCH-INCREASING CONVERSION

PULSE PITCH-DECREASING CONVERSION

FIG. 8A (a) L1
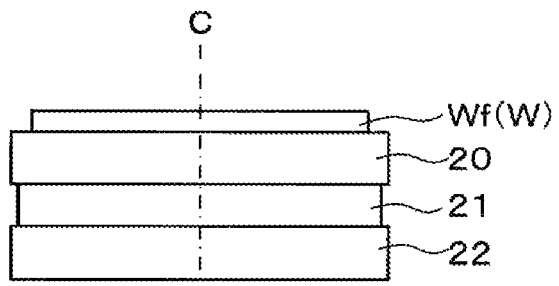
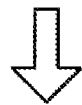
FIG. 8B (b) L2
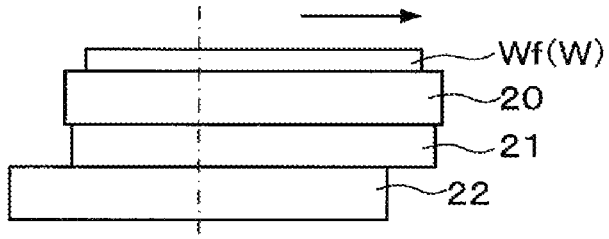
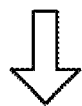
FIG. 8C (c) L3
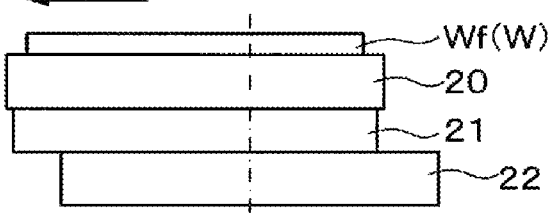
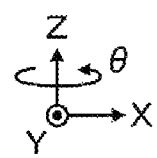

| POSITION OF LINEAR MOTOR (mm) | POSITIONAL CORRECTION AMOUNT OF TABLE IN Y-AXIS DIRECTION (μm) | | | | |
|---|---|---|---|---|---|
| | L3 LINE BREAK 100mm | L5 LINE BREAK -50mm | L1 LINE BREAK 0mm | L4 LINE BREAK 10mm | L2 LINE BREAK 100mm |
| 0 | -2 | -1 | 0 | 0.2 | 2 |
| 100 | -4 | -2 | 0 | 0.4 | 4 |
| 200 | -6 | -3 | 0 | 0.6 | 6 |
| 300 | -8 | -4 | 0 | 0.8 | 8 |
| 400 | -10 | -5 | 0 | 1 | 10 |
| 500 | -12 | -6 | 0 | 1.2 | 12 |
| 600 | -14 | -7 | 0 | 1.4 | 14 |
| 700 | -16 | -8 | 0 | 1.6 | 16 |
| 800 | -18 | -9 | 0 | 1.8 | 18 |
| 900 | -20 | -10 | 0 | 2 | 20 |

DROPLET EJECTING APPARATUS HAVING CORRECTABLE MOVEMENT MECHANISM FOR WORKPIECE TABLE AND DROPLET EJECTING METHOD

CROSS-REFERENCE TO RELATED APPLICATION

This application is based on and claims priority from Japanese Patent Application No. 2017-042752 filed on Mar. 7, 2017 with the Japan Patent Office, the disclosure of which is incorporated herein in its entirety by reference.

TECHNICAL FIELD

The present disclosure relates to a droplet ejecting apparatus that ejects the drops of a functional liquid onto a workpiece so as to draw a pattern, a droplet ejecting method using the droplet ejecting apparatus, and a computer storage medium.

BACKGROUND

In the related art, as an apparatus for drawing a pattern on a workpiece using a functional liquid, there has been known an inkjet type droplet ejecting apparatus which ejects the droplets of the functional liquid. The droplet ejecting apparatus is widely used, for example, when manufacturing electro-optical devices (flat panel displays (FPD)) such as organic EL devices, color filters, liquid crystal display devices, plasma displays (PDP devices), and electron emitting devices (field emission (FED) devices or surface-condition electron-emitter display (SED) devices).

For example, a droplet ejecting apparatus disclosed in Japanese Patent Application Laid-Open No. 2010-198028 includes a functional liquid droplet ejecting head (droplet ejecting head) which ejects the droplets of a functional liquid, a workpiece stage (workpiece table) on which a workpiece is mounted, and a movement mechanism (linear motor) which moves the workpiece table in a direction in which a pair of support bases for guidance extends (main scanning direction). Further, the droplet ejecting apparatus draws a pattern on the workpiece by ejecting the functional liquid from the droplet ejecting head into a bank formed in advance on the workpiece while moving the workpiece relative to the droplet ejecting head using the workpiece table.

During the drawing operation of the droplet ejecting apparatus, a first drawing operation (forward pass) is performed while the workpiece is moved in the main scanning direction (to the negative direction in the Y-axis direction). Thereafter, the workpiece table is moved in a sub-scanning direction (X-axis direction) orthogonal to the main scanning direction, and then a second drawing operation (backward pass) is performed while the workpiece is moved in the main scanning direction (to the negative side in the Y-axis direction). Further, the workpiece table is moved in the sub-scanning direction (X-axis direction) again, and then a third drawing operation (forward pass) is performed while the workpiece is moved in the main scanning direction (Y-axis positive direction). With this drawing operation, patterns are drawn on the entire surface of the workpiece.

In the following description, the operation of moving the workpiece table in the sub-scanning direction (X-axis direction) during the first to third drawing operations is referred to as a "line break", in some instances.

SUMMARY

The present disclosure provides a droplet ejecting apparatus that ejects droplets of a functional liquid onto a workpiece so as to draw a pattern. The droplet ejecting apparatus includes: a workpiece table configured to place the workpiece thereon; a droplet ejecting head configured to eject the droplets onto the workpiece placed on the workpiece table; a movement mechanism configured to relatively move the workpiece table and the droplet ejecting head in a main scanning direction and a sub-scanning direction orthogonal to the main scanning direction; and a control unit configured to: detect a position of the workpiece placed on the workpiece table or a position of the workpiece table while relatively moving the workpiece table and the droplet ejecting head along a plurality of scanning lines, which extend in the main scanning direction and are set side by side in the sub-scanning direction; and create, based on the detection result, a correction table that indicates a correlation between a position of the movement mechanism and a positional correction amount of the workpiece table.

The foregoing summary is illustrative only and is not intended to be in any way limiting. In addition to the illustrative aspects, exemplary embodiments, and features described above, further aspects, exemplary embodiments, and features will become apparent by reference to the accompanying drawings and the following detailed description.

BRIEF DESCRIPTION OF THE DRAWINGS

FIGS. 7A to 7C are explanatory views illustrating, in a plan view, states in which drawing operations are performed on a workpiece, in which FIG. 7A illustrates a first drawing operation, FIG. 7B illustrates a second drawing operation, and FIG. 7C illustrates a third drawing operation.

FIGS. 8A to 8C are explanatory views illustrating, in a side view, states in which the drawing operations are performed on the workpiece, in which FIG. 8A illustrates the first drawing operation, FIG. 8B illustrates the second drawing operation, and FIG. 8C illustrates the third drawing operation.

DESCRIPTION OF EMBODIMENT

Figure 1:
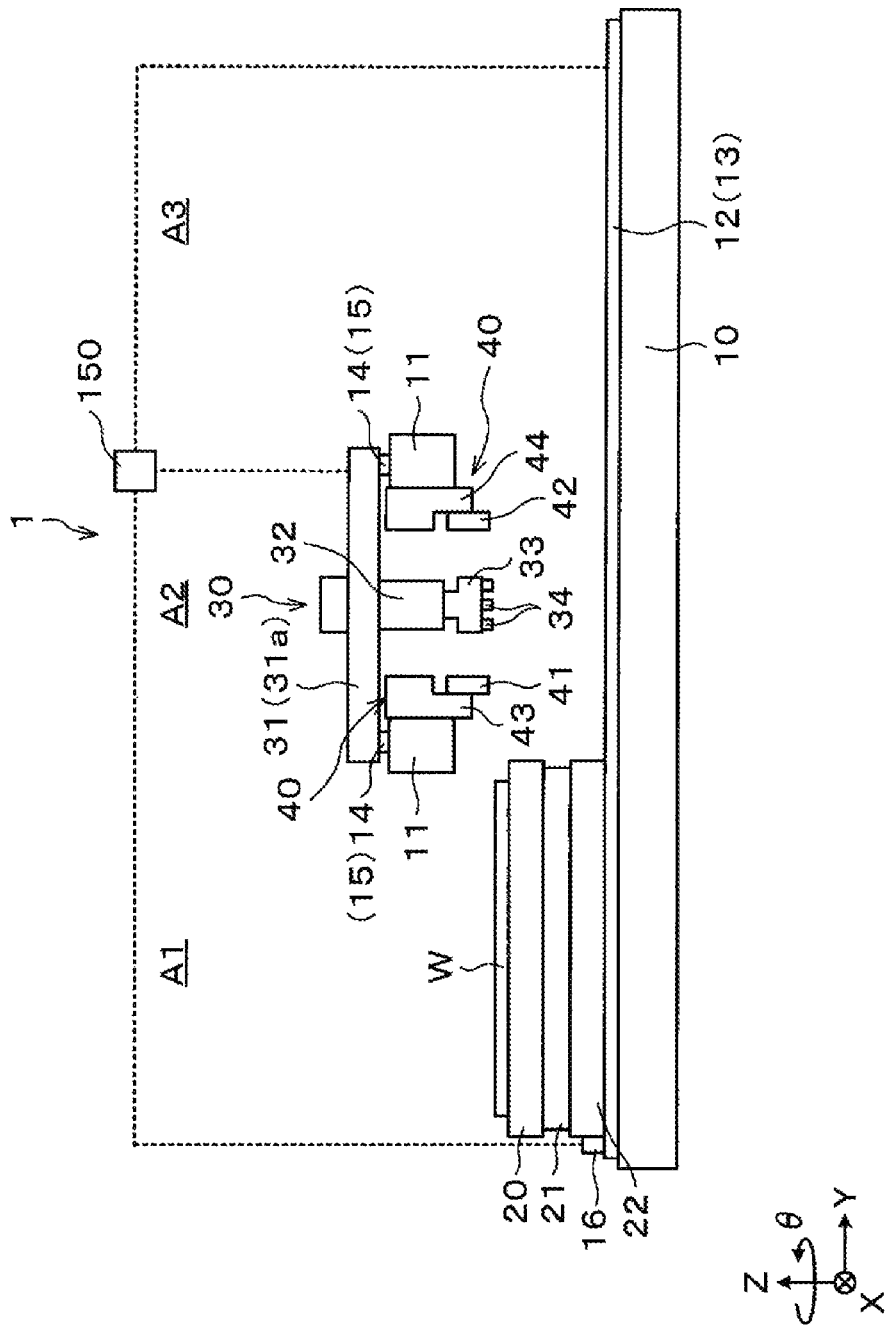
FIG. 1 is a side view illustrating an outline of a configuration of a droplet ejecting apparatus according to the present exemplary embodiment.

In the following detailed description, reference is made to the accompanying drawings, which form a part thereof. The illustrative embodiments described in the detailed description, drawings, and claims are not meant to be limiting. Other exemplary embodiments may be utilized, and other changes may be made without departing from the spirit or scope of the subject matter presented here.

When a line break is performed on the workpiece table, a positional relationship between a droplet ejecting head and a bank on a workpiece is changed in some instances due to factors such as changes in posture, center of gravity, and linearity of the workpiece table. The change in posture, the change in center of gravity, and the change in linearity of the workpiece table may occur due to, for example, mechanical precision of a movement mechanism or non-flatness of a stage on which the workpiece table is moved, when a line break is performed.

Recently, large and high-definition (e.g., 4K or 8K) products have become mainstream in the products such as televisions manufactured using droplet ejecting apparatuses, and the droplet ejecting apparatus are also enlarged as the sizes of the workpieces are enlarged. For this reason, the positional deviation between the droplet ejecting head and the bank due to the aforementioned factors, that is, the positional deviation which occurs while the droplets ejected from the droplet ejecting head land on the bank on the workpiece cannot be ignored. Furthermore, due to the influence of a pixel size, the tolerance range of the positional deviation is also decreased to, for example, ±2 μm or less.

Therefore, in the case of the stage, like the droplet ejecting apparatus, which needs to be precisely controlled, there is a need for a technology of correcting a position of the workpiece table, which is capable of robustly coping with a change in environment. However, in this situation, the precise stage cannot appropriately correct the position of the workpiece table.

The present disclosure has been made in consideration of the aforementioned situations, and an object of the present disclosure is to align a droplet ejecting head and a workpiece with high precision by appropriately correcting a relative position of a workpiece table with respect to the droplet ejecting head in a droplet ejecting apparatus which draws a pattern by ejecting the droplets of a functional liquid onto the workpiece.

To achieve the aforementioned object, the present disclosure provides a droplet ejecting apparatus that ejects droplets of a functional liquid onto a workpiece so as to draw a pattern. The droplet ejecting apparatus includes: a workpiece table configured to place the workpiece thereon; a droplet ejecting head configured to eject the droplets onto the workpiece placed on the workpiece table; a movement mechanism configured to relatively move the workpiece table and the droplet ejecting head in a main scanning direction and a sub-scanning direction orthogonal to the main scanning direction; and a control unit configured to: detect a position of the workpiece placed on the workpiece table or a position of the workpiece table while relatively moving the workpiece table and the droplet ejecting head along a plurality of scanning lines, which extend in the main scanning direction and are set side by side in the sub-scanning direction; and create, based on the detection result, a correction table that indicates a correlation between a position of the movement mechanism and a positional correction amount of the workpiece table.

According to the present disclosure, even though positional deviation of a workpiece with respect to the droplet ejecting head occurs while a line break is performed on the workpiece table, it is possible to align the droplet ejecting head and the workpiece with high precision by appropriately correcting a relative position of the workpiece table with respect to the droplet ejecting head.

Hereinafter, exemplary embodiments of the present disclosure will be described with reference to the accompanying drawings. Further, the present disclosure is not limited by the exemplary embodiments disclosed below.

<Configuration of Droplet Ejecting Apparatus>

Figure 2:
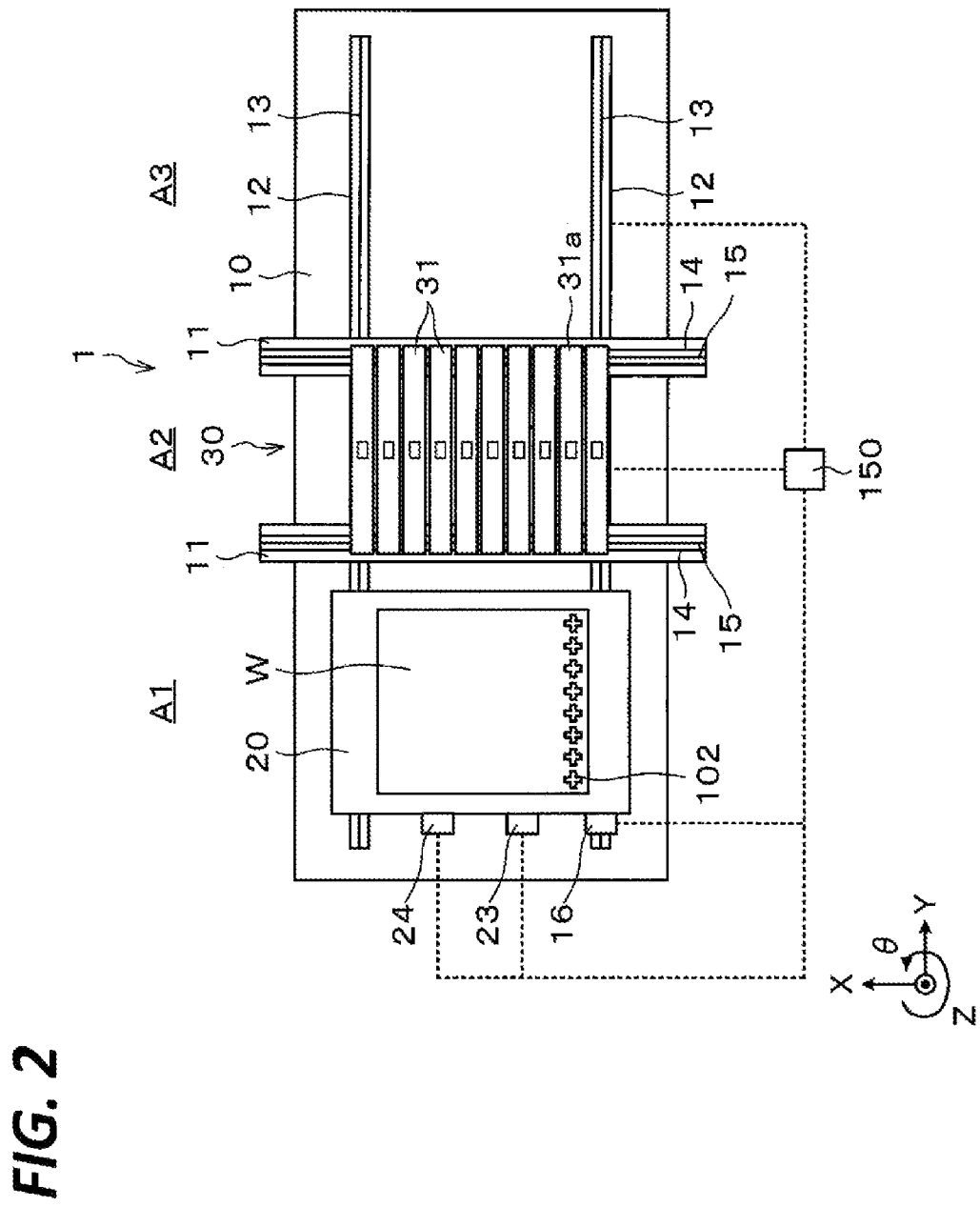
FIG. 2 is a top plan view illustrating an outline of the configuration of the droplet ejecting apparatus according to the present exemplary embodiment.

First, a configuration of a droplet ejecting apparatus according to the present exemplary embodiment will be described with reference to FIGS. 1 and 2. FIG. 1 is a side view illustrating an outline of a configuration of a droplet ejecting apparatus 1. FIG. 2 is a top plan view illustrating an outline of the configuration of the droplet ejecting apparatus 1. Further, hereinafter, a main scanning direction of a workpiece W is defined as a Y-axis direction, a sub-scanning direction orthogonal to the main scanning direction is defined as an X-axis direction, a vertical direction orthogonal to the Y-axis direction and the X-axis direction is defined as a Z-axis direction, and a rotation direction about the Z-axis is defined as a θ direction.

Figure 3:
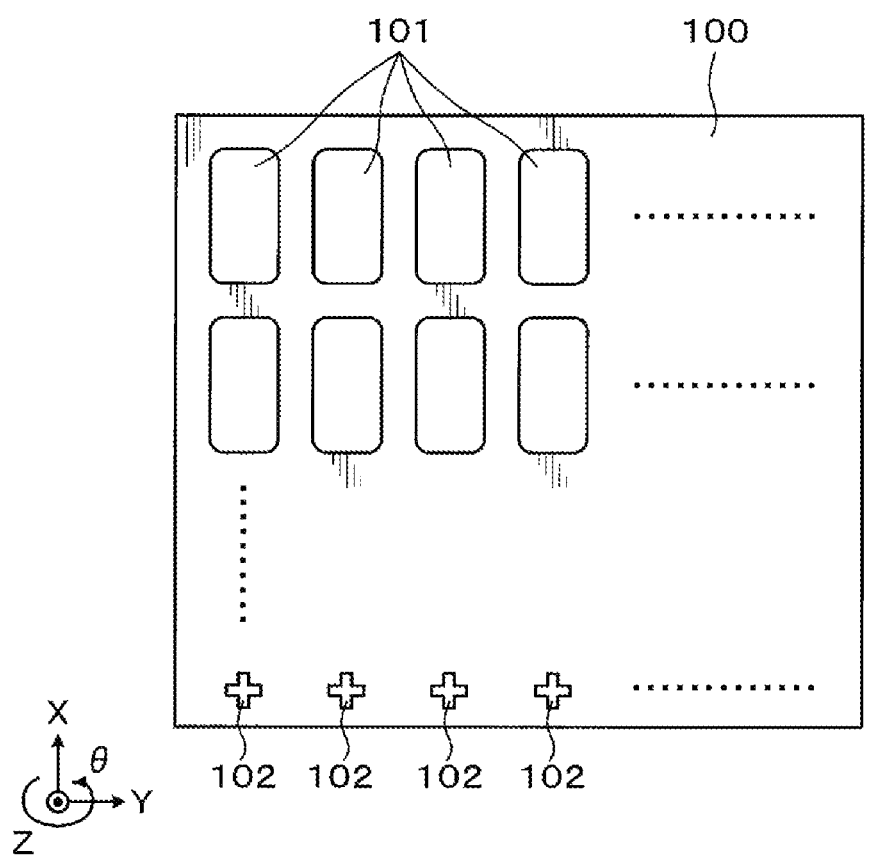
FIG. 3 is a top plan view illustrating a state in which a bank and reference marks are formed on a workpiece.

As illustrated in FIG. 3, a bank 100, which is a partition wall, is formed on the workpiece W used in the present exemplary embodiment. The bank 100 is patterned in a predetermined pattern by performing, for example, a photolithography processing, an etching processing, or the like. A plurality of openings 101 having a substantially rectangular shape are formed in the bank 100 side by side with a predetermined pitch in a row direction (Y-axis direction) and a column direction (X-axis direction). The inside of each of the openings 101 is a landing region, and droplets ejected by the droplet ejecting apparatus 1 are caused to land inside the openings 101. Further, the bank 100 is made of, for example, a photosensitive polyimide resin.

A plurality of reference marks 102 are formed, at an end of the workpiece W, in the Y-axis direction at a pitch equal to the pitch of the openings 101. The reference marks 102 are drawn on an upper surface of the workpiece W using, for example, an inkjet type drawing method. Further, in FIG. 3, nearly cross-shaped marks are drawn as the reference marks 102. However, the shape of the reference marks 102 is not limited by the contents of the present exemplary embodiment. For example, circular or triangular marks may be drawn, and any marks may be arbitrarily set as long as the marks can be identified. In addition, FIG. 3 illustrates a state in which the reference marks 102 are formed at the end of the workpiece W at the negative side in the X-axis direction, but the reference marks 102 may be formed at the end of the workpiece W at the positive side in the X-axis direction.

The workpieces W in the present exemplary embodiment include a reference workpiece Wf for creating correction tables to be described below as well as workpieces W for products for mass-production. Further, reference marks 102 are formed on the reference workpiece Wf, but whether to form the reference marks 102 on the workpieces W for products is arbitrary and the formation of the reference marks 102 may be omitted.

The droplet ejecting apparatus 1 has a Y-axis stage 10 extending in the main scanning direction (Y-axis direction) and moving the workpiece W in the main scanning direction, and a pair of X-axis stages 11 and 11 crossing over the Y-axis stage 10 and extending in the sub-scanning direction (X-axis direction). A pair of Y-axis guide rails 12 and 12 is provided to extend in the Y-axis direction on an upper surface of the Y-axis stage 10, and Y-axis linear motors 13 and 13, as a movement mechanism, are provided on the Y-axis guide rails 12 and 12, respectively. X-axis guide rails 14 and 14 are provided to extend in the X-axis direction on upper surfaces of the X-axis stages 11 and 11, respectively, and X-axis linear motors 15 and 15 are provided on the X-axis guide rails 14 and 14, respectively. Further, in the following description, on the Y-axis stage 10, an area at the negative side with respect to the X-axis stages 11 in the Y-axis direction is defined as a loading and unloading area A1, an area between the pair of X-axis stages 11 and 11 is defined as a processing area A2, and a positive side area with respect to the X-axis stages 11 in the Y-axis direction is defined as a standby area A3.

A Y-axis linear scale 16, as a position measuring device for measuring a position of the Y-axis linear motor 13, is provided on the Y-axis linear motor 13. An encoder pulse (pulse signal), which indicates the position of the Y-axis linear motor 13, is output from the Y-axis linear scale 16. Further, the position of the Y-axis linear motor 13 means a position of a movable element of the Y-axis linear motor 13.

A workpiece table 20 is provided on the Y-axis stage 10. Carriage units 30 and image capturing units 40 are provided on the pair of X-axis stages 11 and 11.

The workpiece table 20 is, for example, a vacuum suction table, and is configured to mount the workpiece W thereon by holding the workpiece W by suction. The workpiece table 20 is supported by a table movement mechanism 21 provided at a lower side of the workpiece table 20 so that the workpiece table 20 is movable in the X-axis direction and rotatable in the θ direction. The workpiece table 20 and the table movement mechanism 21 are supported on a Y-axis slider 22 provided at a lower side of the table movement mechanism 21. The Y-axis slider 22 is mounted on the Y-axis guide rails 12 and configured to be movable in the Y-axis direction by the Y-axis linear motors 13. Therefore, the workpiece table 20 is moved by the Y-axis slider 22 in the Y-axis direction along the Y-axis guide rails 12 in a state in which the workpiece W is placed on the workpiece table 20 such that the workpiece W may be moved in the Y-axis direction. Further, in the present exemplary embodiment, the table movement mechanism 21 is configured to move the workpiece table 20 in the X-axis direction and rotate the workpiece table 20 in the θ direction, but a mechanism for moving the workpiece table 20 in the X-axis direction and a mechanism for rotating the workpiece table 20 in the θ direction may be separately provided.

The table movement mechanism 21 is provided with an X-axis linear scale 23 which measures a position of the table movement mechanism 21 in the X-axis direction, and a rotary encoder 24 which measures a position of the table movement mechanism 21 in the θ direction. Encoder pulses (pulse signals), which indicate the position of the table movement mechanism 21 (workpiece table 20) in the X-axis direction and the position of the table movement mechanism 21 (workpiece table 20) in the θ direction, respectively, are output from the X-axis linear scale 23 and the rotary encoder 24, respectively.

A workpiece alignment camera (not illustrated), which captures an image of the workpiece W placed on the workpiece table 20, is provided above the workpiece table 20 in the loading and unloading area A1. Further, based on the image captured by the workpiece alignment camera, the position in the Y-axis direction, the position in the X-axis direction, and the position in the θ direction of the workpiece W placed on the workpiece table 20 are corrected by the Y-axis slider 22 and the table movement mechanism 21, as necessary. Therefore, the workpiece W is aligned such that a predetermined initial position of the workpiece W is set.

A plurality of (e.g., ten) carriage units 30 are provided on the X-axis stages 11. Each of the carriage units 30 has a carriage plate 31, a carriage holding mechanism 32, a carriage 33, and a droplet ejecting head 34 as a processor. The carriage holding mechanism 32 is provided at the center of a lower side of the carriage plate 31, and the carriage 33 is detachably mounted on the lower end of the carriage holding mechanism 32.

The carriage plate 31 is mounted on the X-axis guide rails 14 and may be moved by the X-axis linear motors 15 in the X-axis direction. Further, a plurality of carriage plates 31 may be integrally moved in the X-axis direction.

A motor (not illustrated) is mounted on the carriage 33. The carriage 33 is configured to be movable in the X-axis direction and the θ direction by the motor. Further, the movements of the carriage 33 in the X-axis direction and the θ direction may be performed by, for example, the carriage holding mechanism 32.

A plurality of droplet ejecting heads 34 are arranged side by side in the Y-axis direction and the X-axis direction at a lower side of the carriage 33. In the present exemplary embodiment, for example, the six droplet ejecting heads 34 are provided in the Y-axis direction, and the two droplet ejecting heads 34 are provided in the X-axis direction. That is, the total of twelve droplet ejecting heads 34 are provided. A plurality of ejecting nozzles (not illustrated) are disposed in a lower surface, that is, a nozzle surface of the droplet ejecting head 34. Further, the droplets of a functional liquid are ejected from the ejecting nozzles to droplet ejecting positions directly under the droplet ejecting heads 34.

The image capturing units 40 are disposed at a position which approximately overlaps, in a plan view, a trajectory of the reference marks 102 on the workpiece W when the workpiece table 20 is moved in the Y-axis direction by the Y-axis linear motors 13. Specifically, as illustrated in, for example, FIG. 2, the image capturing unit 40 is provided on the carriage plate when the second carriage plate 31a up from the lower side at the negative end in the X-axis direction approximately overlaps the trajectory of the reference marks 102 when the workpiece W is moved in the Y-axis direction. Further, the image capturing unit 40 may be configured to be movable in the X-axis direction.

The image capturing units 40 include a first image capturing unit 41 and a second image capturing unit 42 which are provided to face each other in the Y-axis direction with the carriage 33 (droplet ejecting head 34) interposed therebetween. For example, a CCD camera is used as the first image capturing unit 41 and the second image capturing unit 42, and the first image capturing unit 41 and the second image capturing unit 42 may capture images of the workpiece W placed on the workpiece table 20 even while the workpiece table 20 is being moved or stopped or workpiece processing (ejecting of droplet) is performed. The first image capturing unit 41 is disposed at the negative side in the Y-axis direction with respect to the carriage 33, and the second image capturing unit 42 is disposed at the positive side in the Y-axis direction with respect to the carriage 33.

The first image capturing unit 41 captures an image of the reference mark 102 formed on the workpiece W. The first image capturing unit 41 is supported on a base 43 provided at a side of the X-axis stage 11 of the pair of X-axis stages 11 and 11 which is provided at the negative side in the Y-axis direction. Further, when the workpiece W is moved from the loading and unloading area A1 toward the processing area A2 and the workpiece table 20 is guided to a position directly under the first image capturing unit 41, the first image capturing unit 41 captures images of the workpiece W placed on the workpiece table 20 at a predetermined cycle. The acquired captured images are input to a detector 160 of a control unit 150 which will be described below. Further, an image capturing timing of the first image capturing unit 41 may be determined, for example, based on the converted pulse signal which is output from a corrector 161 to be described below, or the image capturing timing of the first image capturing unit 41 may be predetermined before the workpiece processing.

The second image capturing unit 42 is supported on a base 44 provided at a side of the X-axis stage 11 which is provided at a positive side in the Y-axis direction among the pair of X-axis stages 11 and 11. Further, when the workpiece table 20 is guided to a position directly under the second image capturing unit 42, the second image capturing unit 42 captures an image of the workpiece W placed on the workpiece table 20, thereby capturing an image of the droplets landing on the upper surface of the workpiece W.

The captured images of the workpiece W, which are captured by the first image capturing unit 41 and the second image capturing unit 42, are identical to the aforementioned captured images when the workpiece table 20 passes forward (to the positive side in the Y-axis direction), but the images of the workpiece W, which are captured by the first image capturing unit 41 and the second image capturing unit 42, are opposite to the aforementioned captured images when the workpiece table 20 passes backward (to the negative side in the Y-axis direction).

<Control Unit>

The droplet ejecting apparatus 1 is provided a control unit 150. The control unit 150 is, for example, a computer and has a data storing unit (not illustrated). For example, the data storing unit stores drawing data (bitmap data) for drawing a predetermined pattern on the workpiece W by controlling the droplets which are ejected onto the workpiece W. In addition, the control unit 150 has a program storing unit (not illustrated). The program storing unit stores a program for controlling various types of processing in the droplet ejecting apparatus 1.

The data or the program are recorded in, for example, a computer-readable storage medium such as a computer-readable hard disk (HD), a flexible disk (FD), a compact disk (CD), a magneto-optical disk (MO), and a memory card, and may be installed in the control unit 150 from the storage medium.

Figure 4:
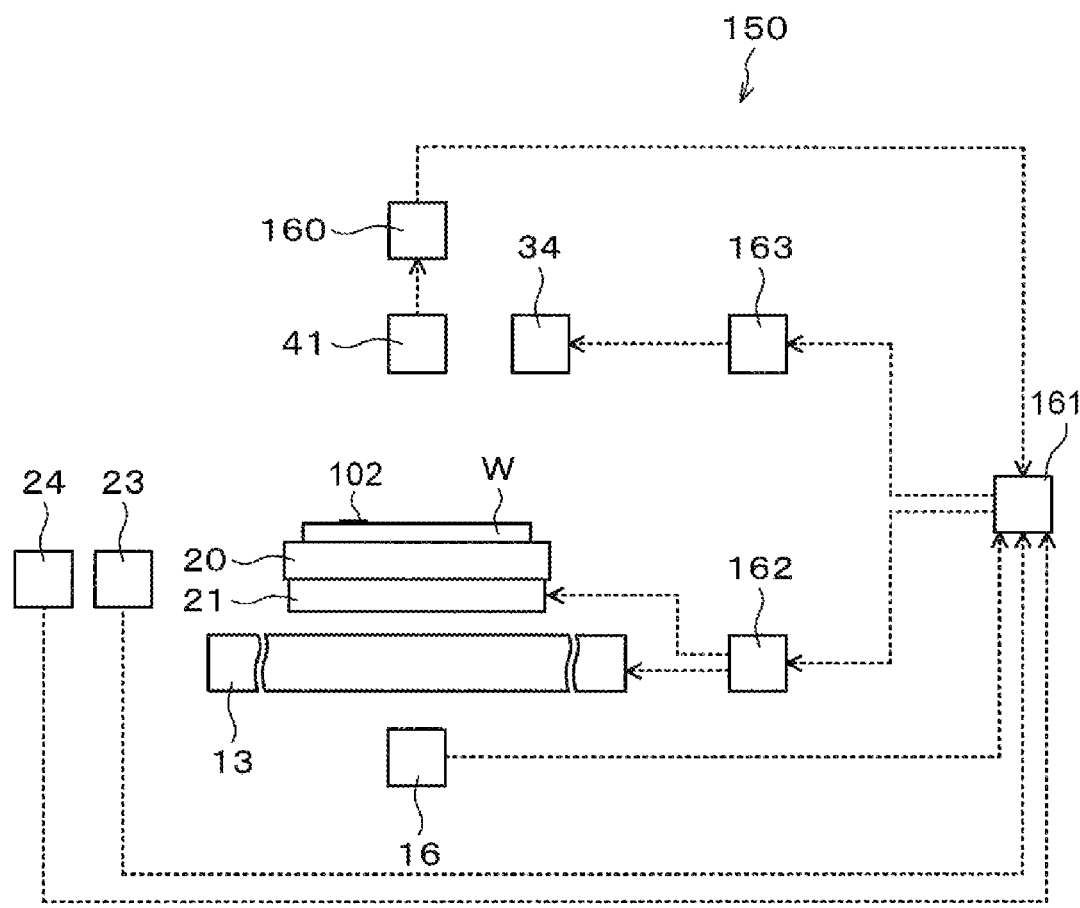
FIG. 4 is an explanatory view schematically illustrating an outline of a configuration of a control unit.

As illustrated in FIG. 4, the control unit 150 has the detector 160 which detects the positions of the reference marks 102 based on the captured image by processing the captured image acquired by the first image capturing unit 41 (or second image capturing unit 42), the corrector 161 which corrects the position of the workpiece table 20 (positions of the Y-axis linear motor 13 and the table movement mechanism 21), a motion controller 162 (motion driver) which controls the movements of the Y-axis linear motors 13 and the table movement mechanism 21, and an inkjet controller 163 which controls an ejecting timing of the droplet ejecting head 34.

(Detector)

Any method of detecting the positions (center positions) of the reference marks 102 using the detector 160 may be used, but, for example, a method disclosed in Japanese Patent Application Laid-Open No. 2017-013011 may be used. Further, the detector 160 detects the position of the workpiece W by detecting the positions of the plurality of reference marks 102. In addition, the first image capturing unit 41 is provided on the X-axis stages 11 on which the droplet ejecting head 34 is mounted, and as a result, the detector 160 detects the position of the workpiece W with respect to the droplet ejecting head 34. Further, the captured image acquired by the first image capturing unit 41 includes a Y-axis component, an X-axis component, and a θ component, and the positions of the workpiece W detected by the detector 160 include a position in the Y-axis direction, a position in the X-axis direction, and a position in the θ direction.

Based on the detected position of the workpiece W, the detector 160 may further calculate the positional deviation amount of from a target position of the workpiece W. Any method of calculating the positional deviation amount of the workpiece W may be used, but for example, the method disclosed in Japanese Patent Application Laid-Open No. 2017-013011 may be used. That is, based on the position of the Y-axis linear motor 13 measured by the Y-axis linear scale 16, the target position of the workpiece W is estimated using the method. Further, the positional deviation amount is calculated by comparing the calculated target position of the workpiece W with the position of the workpiece W detected by the detector 160. Further, the positional deviation amount of the workpiece W includes a position in the Y-axis direction, a pitch in the Y-axis direction, a yaw in the Y-axis direction, a position in the X-axis direction based on the position in the Y-axis direction, and a position in the θ direction based on the position in the Y-axis direction.

Figure 5:
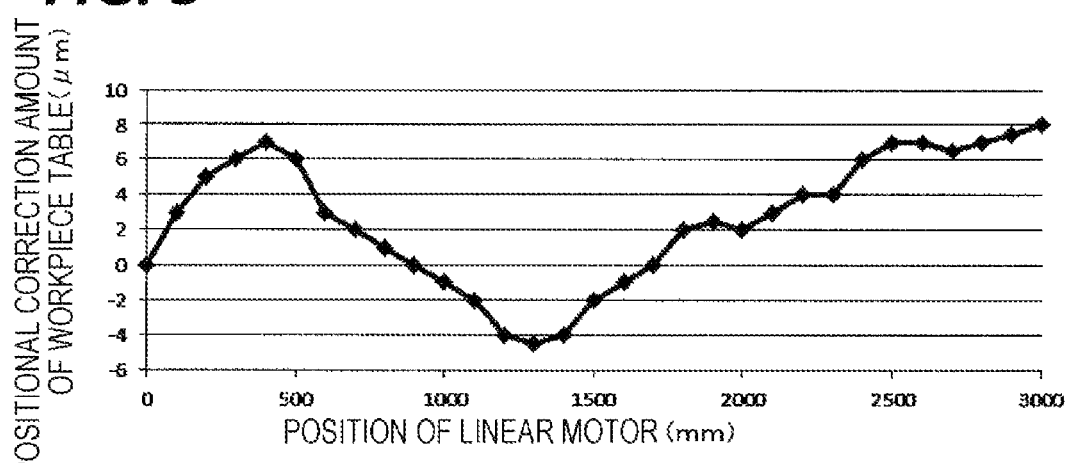
FIG. 5 is a view illustrating an example of a correction table.

Based on the positional deviation amount of the workpiece W which is calculated as described above, the detector 160 may further create a correction table illustrated in FIG. 5. The correction table is created by plotting the positional deviation amount of the workpiece W in the Y-axis direction with respect to the position of the Y-axis linear motor 13 for one stroke of the Y-axis linear motor 13, for example, for each pitch of 100 mm. The positional deviation amount of the workpiece W indicates the positional correction amount of the workpiece W, that is, the positional correction amount of the workpiece table 20. Therefore, a horizontal axis of the correction table indicates the position of the Y-axis linear motor 13, a vertical axis of the correction table indicates the positional correction amount of the workpiece table 20, and the correction table indicates how much the position of the workpiece table 20 may be moved with respect to the position of the Y-axis linear motor 13 measured by the Y-axis linear scale 16. Further, the correction table illustrated in FIG. 5 indicates an example of the positional correction amount of the workpiece table 20 in the Y-axis direction, but the correction tables are created in respect to the pitch in the Y-axis direction, the yaw in the Y-axis direction, the position in the X-axis direction based on the position in the Y-axis direction, and the position in the θ direction based on the position in the Y-axis direction, respectively, in addition to the position of the workpiece table 20 in the Y-axis direction. Therefore, a posture of the workpiece table 20 may be corrected by correcting the position of the Y-axis linear motor 13 in the Y-axis direction and correcting the positions of the table movement mechanism 21 in the X-axis direction and the θ direction. Further, the correction table illustrated in FIG. 5 is created by performing two-dimensional interpolation on the plotting, but multidimensional interpolation may be performed.

As described above, the detector 160 calculates any one of the position of the workpiece W, the positional deviation amount of the workpiece W, and the correction table. Further, a signal of a detection result of the detector 160 is output to the corrector 161. Further, the correction table is created by the corrector 161 in the case in which the position of the workpiece W or the positional deviation amount of the workpiece W is output from the detector 160 to the corrector 161.

In the foregoing description, the detector 160 detects the position of the workpiece W using the image captured by the first image capturing unit 41, but this process is performed when the workpiece table 20 (Y-axis linear motor 13) is moved from the loading and unloading area A1 to the processing area A2 (forward pass). Meanwhile, the detector 160 detects the position of the workpiece W using the image captured by the second image capturing unit 42 when the workpiece table 20 is moved from the standby area A3 to the processing area A2 (backward pass).

In addition, the detector 160 detects the position of the workpiece W based on the captured image acquired by the first image capturing unit 41 which is the CCD camera, but, for example, the detector 160 may detect the position of the workpiece W using a laser interferometer (not illustrated) or a laser displacement meter (not illustrated). In the case in which the laser interferometer or the laser displacement meter is used, the position of the workpiece W with respect to the droplet ejecting head 34 is detected by emitting a laser beam to the droplet ejecting head 34 and the workpiece table 20 or the workpiece W. In this case, the position in the Y-axis direction is detected as the position of the workpiece W when the position of the workpiece W is measured using, for example, length measuring devices (the laser interferometer or the laser displacement meter) disposed in a single row, and the position in the Y-axis direction and the position in the θ direction are detected when, for example, length measuring devices disposed in two rows are used.

(Corrector)

Based on a pulse signal from the Y-axis linear scale 16 and a signal from the detector 160, the corrector 161 calculates the positional correction amount of the workpiece table 20 using the correction table. Further, the positional correction amount is fed back to the motion controller 162. Specifically, the following steps S1 to S3 are performed.

First, the corrector 161 recognizes the current position of the Y-axis linear motor 13 by receiving and counting the pulse signal from the Y-axis linear scale 16. In addition, the corrector 161 analyzes a shape (pulse shape) of the pulse signal from the Y-axis linear scale 16 in order to convert the pulse signal in the following step S3 (step S1). In step S1, the corrector 161 also receives the pulse signal from the X-axis linear scale 23 and the pulse signal from the rotary encoder 24.

Next, the corrector 161 receives the signal of the detection result from the detector 160. The signal from the detector 160 corresponds to any one of the position of the workpiece W, the positional deviation amount of the workpiece W, and the correction table as described above. In addition, in the case in which the signal from the detector 160 correspond to the position of the workpiece W or the positional deviation amount of the workpiece W, the correction table is created by the corrector 161. Further, based on the position of the Y-axis linear motor 13 recognized in step S1, the positional correction amount of the workpiece table 20 is calculated using the correction table. Specifically, two-dimensional interpolation or multidimensional interpolation is performed on the correction table. Further, FIG. 5 illustrates the correction table created by the two-dimensional interpolation. The calculation of the positional correction amount is performed while the Y-axis linear motor 13 (workpiece table 20) is moved, and the positional correction amount is calculated corresponding to the position of the Y-axis linear motor 13 which is changed from moment to moment. Therefore, the corrector 161 calculates the positional correction amount of the workpiece table 20 at the current position in real time (step S2).

Figure 6A:
FIGS. 6A to 6D are explanatory views each illustrating a state in which a pulse signal is converted by a corrector.
Figure 6B:
Figure 6C:
Figure 6D:

Next, based on the pulse shape analyzed in step S1 and the positional correction amount of the workpiece table 20 in the Y-axis direction calculated in step S2, the corrector 161 converts the pulse signal received from the Y-axis linear scale 16. FIGS. 6A to 6D illustrate states of converting pulse signals, in which the left view illustrates the pulse signals received from the Y-axis linear scale 16, and the right view illustrates the pulse signals output to the motion controller 162 after conversion. For example, in the case in which the positions of the plurality of reference marks 102 deviate overall with respect to a pulse signal, the pulse is inserted as illustrated in FIG. 6A, or the pulse is eliminated as illustrated in FIG. 6B. In addition, for example, when it is desired to impart a slope to the pulse signal in the case in which the workpiece W is expanded and contracted from the positions of the plurality of reference marks 102, the pulse pitch is increased as illustrated in FIG. 6C, or the pulse pitch is decreased as illustrated in FIG. 6D. Further, the converted pulse signal is output to the motion controller 162 (step S3).

The pulse signal, which is converted in step S3 as described above, is also output to the inkjet controller 163. The inkjet controller 163 controls the droplet ejecting timing of the droplet ejecting head 34, and the droplet ejecting timing is set based on the position of the Y-axis linear motor 13. In the present exemplary embodiment, the pulse signal output from the corrector 161 is output to the inkjet controller 163, and as a result, it is possible to eject the droplets from the droplet ejecting head 34 at an appropriate timing.

In step S3, based on the positional correction amounts of the workpiece table 20 in the X-axis direction and the θ direction which are calculated in step S2, the corrector 161 converts the pulse signal from the X-axis linear scale 23 and the pulse signal from the rotary encoder 2. The converted pulse signals are output to the motion controller 162.

In the case in which the Y-axis linear motor 13 is moved at a high speed, the corrector 161, which calculates the positional correction amount in real time, needs to perform a high-speed processing. For this reason, the corrector 161 may be implemented to have functions of an application specific integrated circuit (ASIC) or a field programmable gate array (FPGA).

(Motion Controller)

Based on the pulse signal (pulse signal after conversion) in the Y-axis direction which is received from the corrector 161, the motion controller 162 controls the movement of the Y-axis linear motor 13 (workpiece table 20) by outputting a command signal (pulse train) to the Y-axis linear motor 13. In addition, based on the pulse signals (pulse signals after conversion) in the X-axis direction and the θ direction which are received from the corrector 161, the motion controller 162 controls the movement of the table movement mechanism 21 by outputting the command signal (pulse train) to the table movement mechanism 21. Further, the motion controller 162 receives the pulse signal related to the Y axis, the X axis, and the θ, thereby configuring fully closed control.

(Inkjet Controller)

Based on the pulse signal (pulse signal after conversion) in the Y-axis direction which is received from the corrector 161, the inkjet controller 163 controls the droplet ejecting timing of the droplet ejecting head 34 by outputting the command signal (pulse train) to the droplet ejecting head 34.

<Processing on Workpiece in Droplet Ejecting Apparatus>

Next, a processing performed on a workpiece using the droplet ejecting apparatus 1 configured as described above will be described. In the present exemplary embodiment, prior to performing a typical processing on a workpiece W for a product, a predetermined processing is performed on a reference workpiece Wf in order to create a correction table.

(Processing on Reference Workpiece)

First, a predetermined processing is performed on a reference workpiece Wf. The workpiece table 20 is disposed in the loading and unloading area A1, and the reference workpiece Wf, which is loaded into the droplet ejecting apparatus 1 by a transport mechanism (not illustrated), is placed on the workpiece table 20. Next, an image of the reference workpiece Wf placed on the workpiece table 20 is captured by the workpiece alignment camera. Further, based on the captured image, the positions of the reference workpiece Wf, which is placed on the workpiece table 20, in the X-axis direction and the θ direction are corrected by the table movement mechanism 21 such that the alignment of the reference workpiece Wf is performed (step T1).

Thereafter, the workpiece table 20 is reciprocally moved in the Y-axis direction by the Y-axis linear motor 13 and is moved in the X-axis direction (performs a line break) such that patterns are drawn on the entire surface of the reference workpiece Wf. In the present exemplary embodiment, descriptions will be made of a case in which two line breaks are performed in the X-axis direction, that is, the workpiece table 20 moves along three scanning lines extending in the Y-axis direction (main scanning direction). In addition, in the present exemplary embodiment, as illustrated in FIG. 7A to 7C, descriptions will be made of a case in which the two droplet ejecting heads 34 are used among the plurality of droplet ejecting heads 34.

Figure 7A:
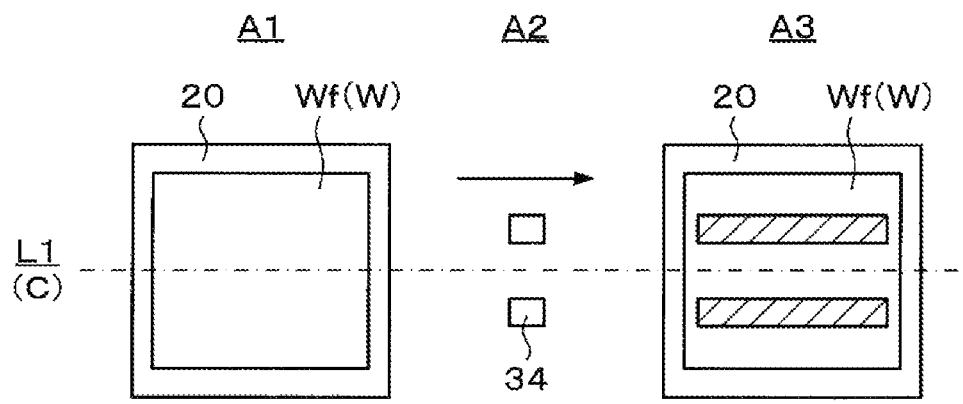
Figure 7B:
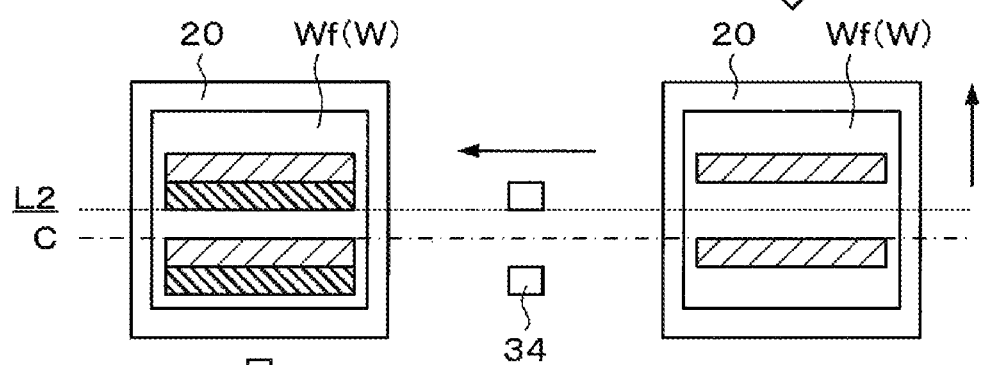
Figure 7C:
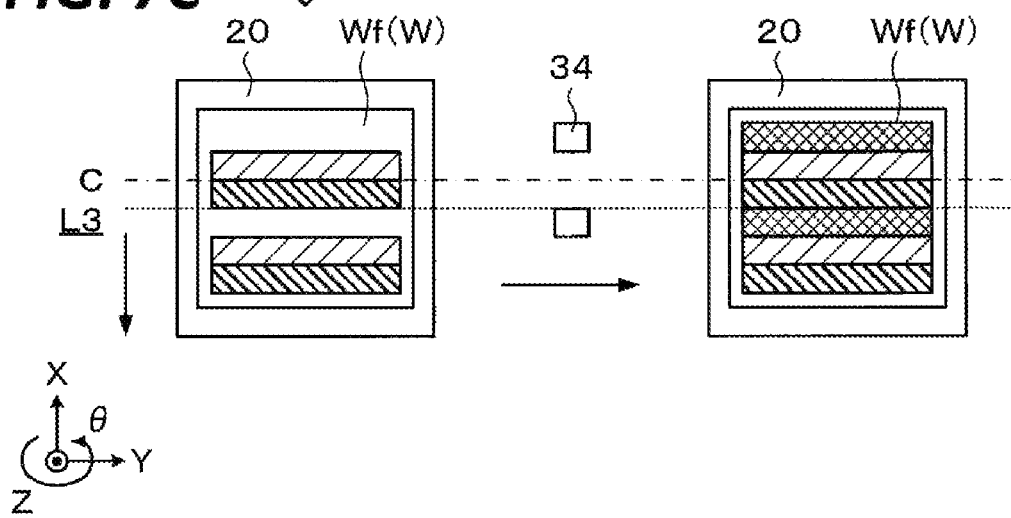

First, as illustrated in FIGS. 7A and 8A, the first drawing operation (forward pass) is performed while the workpiece table 20 is moved from the loading and unloading area A1 to the standby area A3 (to the positive side in the Y-axis direction) along a first scanning line L1 by the Y-axis linear motor 13. The first scanning line L1 is a line passing through a centerline C of the workpiece table 20 in the X-axis direction. In this case, in the processing area A2, the droplets are ejected from the droplet ejecting head 34 onto the reference workpiece Wf which is moved to the position under the droplet ejecting head 34. Then, a pattern is drawn at a position of the reference workpiece Wf which corresponds to the droplet ejecting head 34 (step T2).

Here, in step T2, the position of the Y-axis linear motor 13 is measured in real time by the Y-axis linear scale 16 while the workpiece table 20 is moved from the loading and unloading area A1 to the processing area A2, that is, before the droplets are ejected onto the reference workpiece Wf from the droplet ejecting head 34 in the processing area A2. The pulse signal from the Y-axis linear scale 16 is output to the corrector 161. In addition, the positions of the table movement mechanism 21 in the X-axis direction and the θ direction are also measured by the X-axis linear scale 23 and the rotary encoder 24, respectively, and the pulse signal from the X-axis linear scale 23 and the pulse signal from the rotary encoder 24 are also output to the corrector 161.

Meanwhile, in this case, the first image capturing unit 41 captures images of the reference workpiece Wf placed on the workpiece table 20 at a predetermined cycle, and the detector 160 detects the position of the reference workpiece Wf. A signal of a detection result of the detector 160 is output to the corrector 161. Further, a correction table is created by the corrector 161. Further, the correction table may be created by the detector 160. Hereinafter, a correction table, which is created for the first scanning line L1, is referred to as a first reference correction table.

Next, as illustrated in FIGS. 7B and 8B, the workpiece table 20 is moved (performs a line break) to the positive side by the table movement mechanism 21 in the X-axis direction by one carriage. Next, the second drawing operation (backward pass) is performed while the workpiece table 20 is moved from the standby area A3 to the loading and unloading area A1 (to the negative side in the Y-axis direction) along a second scanning line L2 by the Y-axis linear motor 13. That is, the second scanning line L2 is a line passing through the positive side in the X-axis direction with respect to the centerline C of the workpiece table 20 in the X-axis direction. In this case, in the processing area A2, the droplets are ejected from the droplet ejecting head 34 onto the reference workpiece Wf which is moved to the position under the droplet ejecting head 34. Then, a pattern is drawn at a position of the reference workpiece Wf which corresponds to the droplet ejecting head 34 (step T3).

Even in step T3, as in step T2, a correction table is created by the corrector 161 or the detector 160. Further, in step T3, the detector 160 detects the position of the workpiece W using the image captured by the second image capturing unit 42 while the workpiece table 20 is moved from the standby area A3 to the processing area A2. Hereinafter, a correction table, which is created with respect to the second scanning line L2, will be referred to as a second reference correction table.

Next, as illustrated in FIGS. 7C and 8C, the workpiece table 20 is moved (performs a line break) by the table movement mechanism 21 to the negative side in the X-axis direction by two carriages. Next, the third drawing operation (forward pass) is performed while the workpiece table 20 is moved from the loading and unloading area A1 to the standby area A3 (in the Y-axis positive direction) along a third scanning line L3 by the Y-axis linear motor 13. That is, the third scanning line L3 is a line passing the negative side in the X-axis direction with respect to the centerline C of the workpiece table 20 in the X-axis direction. In this case, in the processing area A2, the droplets are ejected from the droplet ejecting head 34 onto the reference workpiece Wf which is moved to the position under the droplet ejecting head 34. Then, a pattern is drawn at a position of the reference workpiece Wf which corresponds to the droplet ejecting head 34 (step T4). Even in step T4, as in step T2, a correction table is created by the corrector 161 or the detector 160. Hereinafter, a correction table, which is created with respect to the third scanning line L3, will be referred to as a third reference correction table.

In this way, the patterns are drawn on the entire surface of the workpiece by the drawing operations in steps T2 to T4, and the first to third reference correction tables are created with respect to the first to third scanning lines L1 to L3, respectively.

After the third drawing operation, the workpiece table 20 positioned in the standby area A3 is moved to the loading and unloading area A1, and the reference workpiece Wf is unloaded from the droplet ejecting apparatus 1. In this case, in the processing area A2, no droplet is ejected onto the reference workpiece Wf from the droplet ejecting head 34.

(Processing on Workpiece for Product)

Next, a predetermined processing is performed on a workpiece W for a product. During the processing on the workpiece W, first, in the loading and unloading area A1, the positions of the workpiece W, which is placed on the workpiece table 20, in the X-axis direction and the θ direction are corrected such that the alignment of the workpiece W is performed (step T5). Step T5 is identical to the aforementioned step T1.

Thereafter, as illustrated in FIGS. 7A and 8A, the first drawing operation is performed while the workpiece table 20 is moved from the loading and unloading area A1 to the standby area A3 along the first scanning line L1. Further, a pattern is drawn at a position of the workpiece W which corresponds to the droplet ejecting head 34 (step T6). Step T6 is identical to the aforementioned step T2.

Even in step T6, as in step T2, the position of the Y-axis linear motor 13 is measured in real time by the Y-axis linear scale 16. A pulse signal from the Y-axis linear scale 16 is output to the corrector 161. In addition, the positions of the table movement mechanism 21 in the X-axis direction and the θ direction are also measured by the X-axis linear scale 23 and the rotary encoder 24, respectively, and a pulse signal from the X-axis linear scale 23 and a pulse signal from the rotary encoder 24 are also output to the corrector 161.

The corrector 161 performs the aforementioned steps S1 to S3. However, a correction table is created using the signal from the detector 160 in the aforementioned step S2, but in this case, the first reference correction table calculated in step T2 is used instead of using the signal from the detector 160. Further, the positional correction amount of the workpiece table 20 is calculated, and the pulse signal, which is converted based on the positional correction amount, is output to the motion controller 162 from the corrector 161. In addition, among the pulse signals, the pulse signal in the Y-axis direction is also output to the inkjet controller 163.

In step T6, the first image capturing unit 41 captures an image of the workpiece W, the detector 160 detects the position of the workpiece W, and a correction table may be created by the detector 160 or the corrector 161. In this case, the first reference correction table may be used as a base table, and may overlap the correction table created by the detector 160 or the corrector 161.

Based on the pulse signal (pulse signal after conversion) in the Y-axis direction which is received from the corrector 161, the motion controller 162 corrects the position of the Y-axis linear motor 13 by outputting a command signal (pulse train) to the Y-axis linear motor 13. For example, when a target position is 1,000 mm and the target position deviates by +1 μm (extension side), a pulse of a position of 1,000 mm is output to the motion controller 162 even if a pulse of a position of 999.999 mm is received.

Based on the pulse signals (pulse signals after conversion) in the X-axis direction and the θ direction which are received from the corrector 161, the motion controller 162 controls the movement of the table movement mechanism 21 by outputting a command signal (pulse train) to the table movement mechanism 21.

Meanwhile, the inkjet controller 163 also controls the droplet ejecting timing of the droplet ejecting head 34 by outputting a command signal to the droplet ejecting head 34. In this way, the workpiece W placed on the workpiece table 20 is disposed at an appropriate position with respect to the droplet ejecting head 34.

Next, as illustrated in FIGS. 7B and 8B, the workpiece table 20 is moved (performs a line break) in the X-axis positive direction by one carriage, and then the second drawing operation is performed while the workpiece table 20 is moved from the standby area A3 to the loading and unloading area A1 along the second scanning line L2. Further, a pattern is drawn at a position of the workpiece W which corresponds to the droplet ejecting head 34 (step T7). Further, step T7 is identical to the aforementioned step T3. In addition, in this case, with a method identical to the method in step T6, the position of the workpiece table 20 is corrected using the second reference correction table, and the droplet ejecting timing of the droplet ejecting head 34 is controlled.

Next, as illustrated in FIGS. 7C and 8C, the workpiece table 20 is moved (performs a line break) in the X-axis negative direction by two carriages, and then the third drawing operation is performed while the workpiece table 20 is moved from the loading and unloading area A1 to the standby area A3 along the third scanning line L3. Further, a pattern is drawn at a position of the workpiece W which corresponds to the droplet ejecting head 34 (step T8). Further, step T8 is identical to the aforementioned step T4. In addition, in this case, with a method identical to the method in step T6, the position of the workpiece table 20 is corrected using the third reference correction table, and the droplet ejecting timing of the droplet ejecting head 34 is controlled.

In this way, the patterns are drawn on the entire surface of the workpiece by the drawing operations in steps T6 to T8.

When the workpiece table 20 is moved to the loading and unloading area A1, the workpiece W on which the drawing processing is completed is unloaded from the droplet ejecting apparatus 1. Next, the next workpiece W is loaded into the droplet ejecting apparatus 1. Next, the alignment of the workpiece W is performed in the aforementioned step T5, and then steps T6 to T8 are performed.

Steps T5 to T8 are performed on each workpiece as described above, and then a series of processings on the workpiece are terminated.

According to the exemplary embodiment described above, the first to third reference correction tables are created for the first to third scanning lines L1 to L3, respectively, that is, the reference correction tables are created for the entire surface of the workpiece W. For this reason, even though a positional deviation of the workpiece W occurs while a line break is performed on the workpiece table 20, it is possible to appropriately correct the position of the workpiece table 20 using the first to third reference correction tables. Therefore, it is possible to align the droplet ejecting head 34 and the workpiece W with high precision and improve the ejecting precision (landing precision) of droplets onto the workpiece W from the droplet ejecting head 34.

Here, for example, only the first reference correction table may be acquired, and the first reference correction table may be applied in respect to the second scanning line L2 and the third scanning line L3. However, in this case, the appropriate correction amount may not be calculated based on the first reference correction table in respect to the second scanning line L2 and the third scanning line L3 which have been subjected to a line break, and there is a possibility that a droplet ejecting position for ejecting the droplets onto the workpiece W from the droplet ejecting head 34 is deviated. In this regard, according to the exemplary embodiment, the first to third reference correction tables are used for all of the first to third scanning lines L1 to L3, respectively, and as a result, it is possible to more appropriately correct the position of the workpiece table 20.

Another Exemplary Embodiment

Next, another exemplary embodiment of the present disclosure will be described.

In the exemplary embodiment described above, descriptions have been made of a case in which the patterns are drawn on the entire surface of the workpiece W (reference workpiece Wf) while the workpiece table 20 is moved along the three scanning lines L1 to L3. However, the number of scanning lines is not limited thereto.

In the aforementioned exemplary embodiment, the reference correction tables are created for all of the scanning lines L1 to L3, respectively. However, a reference correction table may be created for some of the plurality of scanning lines, and the reference correction table may be interpolated such that reference correction tables may be created for the other scanning lines.

Figures 9, 10:
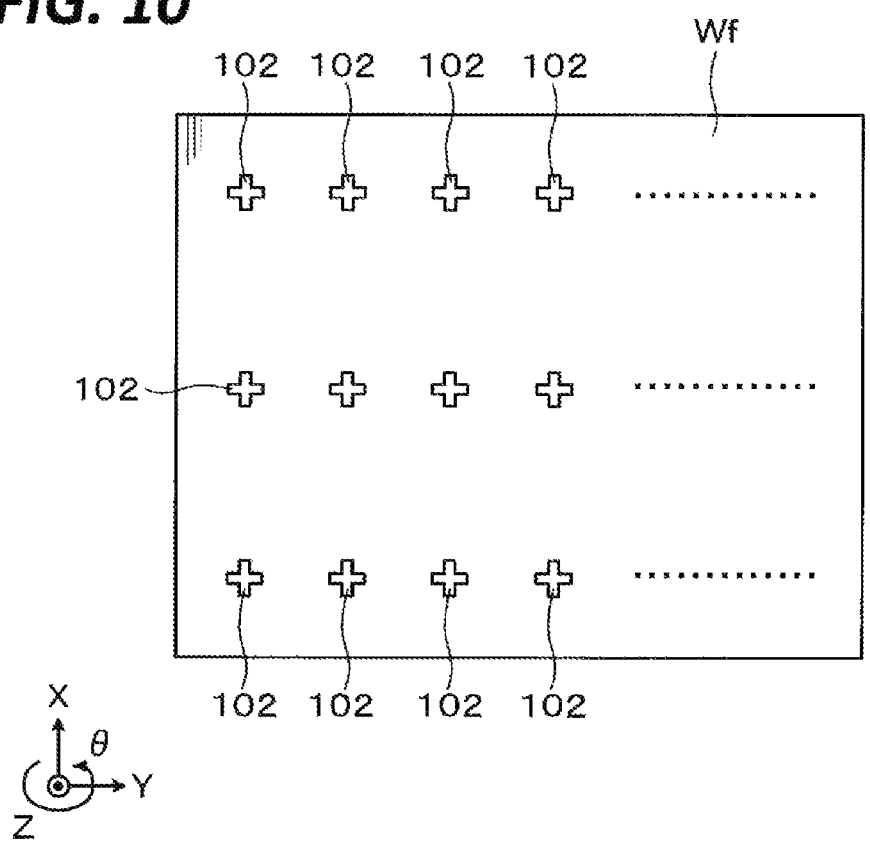
FIG. 9 is a view illustrating an example of a table illustrating interpolation of a reference correction table.
FIG. 10 is a top plan view illustrating a state in which reference marks are formed on a reference workpiece according to another exemplary embodiment.

For example, descriptions will be made of the case, for example, the first to third reference correction tables are created for the first to third scanning lines L1 to L3, respectively, but no correction table is created for the fourth and fifth scanning lines L4 and L5 in the case in which patterns are drawn on the entire surface of the reference workpiece Wf while the workpiece table 20 is moved along five scanning lines L1 to L5 as illustrated in FIG. 9, for example. Further, the first to third reference correction tables are created by performing the aforementioned steps T2 to T4. In addition, in the following description, the first to third reference correction tables will be referred to collectively as reference data in some instances.

In FIG. 9, the first scanning line L1 (line break of 0 mm) is the centerline C of the workpiece table 20 in the X-axis direction, the second scanning line L2 (line break of 100 mm) and the fourth scanning line L4 line break of 10 mm) are scanning lines spaced apart from the centerline C to the positive side in the X-axis direction, and the third scanning line L3 (line break of −100 mm) and the fifth scanning line L5 (line break −50 mm) are scanning lines spaced apart from the centerline C to the negative side in the X-axis direction. In addition, the correction table illustrated in FIG. 9 indicates an example of the positional correction amount the workpiece table 20 in the Y-axis direction, but the correction tables are created for a pitch in the Y-axis direction, a yaw in the Y-axis direction, a position in the X-axis direction based on the position in the Y-axis direction, and a position in the θ direction based on the position in the Y-axis direction, respectively, in addition to the position of the workpiece table 20 in the Y-axis direction.

A fourth reference correction table for the fourth scanning line L4 is created by performing two-dimensional interpolation on the first reference correction table and the second reference correction table. In addition, a fifth reference correction table for the fifth scanning line L5 is created by performing two-dimensional interpolation on the first reference correction table and the third reference correction table. Further, the interpolation method for creating the fourth reference correction table and the fifth reference correction table is not limited to the two-dimensional interpolation. For example, multidimensional interpolation may be applied.

Since a plurality of patterns related to the line breaks are present, it is complicated and difficult to perform steps T2 to T4 for all of the scanning lines. In the present exemplary embodiment, it is possible to acquire the reference correction table by acquiring the reference data by performing steps T2 to T4 in respect to some scanning lines L1 to L3 and interpolating the reference data for the other scanning lines L4 and L5. Therefore, it is possible to create reference correction tables for the entire surface of the workpiece W without performing the complicated operation.

In the exemplary embodiment described above, the reference correction table is created using the reference workpiece Wf illustrated in FIG. 3, but an object to be measured to create a reference correction table is not limited to the reference workpiece Wf. For example, the workpiece W for a product, which is configured as illustrated in FIG. 3, may be used. In this case, the reference correction table is created by performing steps S1 to S3 when performing steps T6 to T8.

The reference correction table may be created using the reference workpiece Wf illustrated in FIG. 10. For example, on the reference workpiece Wf, a plurality of reference marks 102 are formed side by side in the main scanning direction (Y-axis direction) and formed side by side in three columns in the sub-scanning direction (X-axis direction). The number of the reference marks 102 in the X-axis direction is equal to the number of the scanning lines L1 to L3. In this case, the reference marks 102 are positioned always directly under the first image capturing unit 41 or the second image capturing unit 42, and as a result, the detector 160 may more appropriately detect the position of the reference workpiece Wf.

On the reference workpiece Wf, a plurality of reference marks 102 may be formed side by side in the main scanning direction (Y-axis direction) and formed in a single column in the sub-scanning direction (X-axis direction). Further, the first image capturing unit 41 and the second image capturing unit 42 may be configured to be movable in the X-axis direction. A mechanism for moving the first image capturing unit 41 and the second image capturing unit 42 is not particularly limited, but an actuator having a scanning axis, for example, in the X-axis direction is used as the mechanism. Even in this case, it is possible to position the reference mark 102 always directly under the first image capturing unit 41 or the second image capturing unit 42 by moving the first image capturing unit 41 or the second image capturing unit 42 in the X-axis direction.

A plurality of (e.g., three) first image capturing units 41 and a plurality of (e.g., three) second image capturing units 42 may be disposed side by side in the X-axis direction in the case in which a plurality of reference marks 102 are formed side by side in the main scanning direction (Y-axis direction) and formed in a single column in the sub-scanning direction (X-axis direction) as described above. Even in this case, it is possible to cause the reference marks 102 to be always positioned directly under the first image capturing unit 41 or the second image capturing unit 42.

The reference correction table may be created using the workpiece table 20 having the reference marks 102 instead of the reference workpiece Wf or the workpiece W. In this case, since a reference correction table can be created using the workpiece table 20 on which no workpiece W is placed, for example, during maintenance of the droplet ejecting apparatus 1, efficiency is good. Even in the case in which the workpiece table 20 is used, the plurality of reference marks 102 may be formed side by side in the main scanning direction (Y-axis direction) and formed side by side in the sub-scanning direction (X-axis direction) on the upper surface of the workpiece table 20, as illustrated in FIG. 10.

Figure 11:
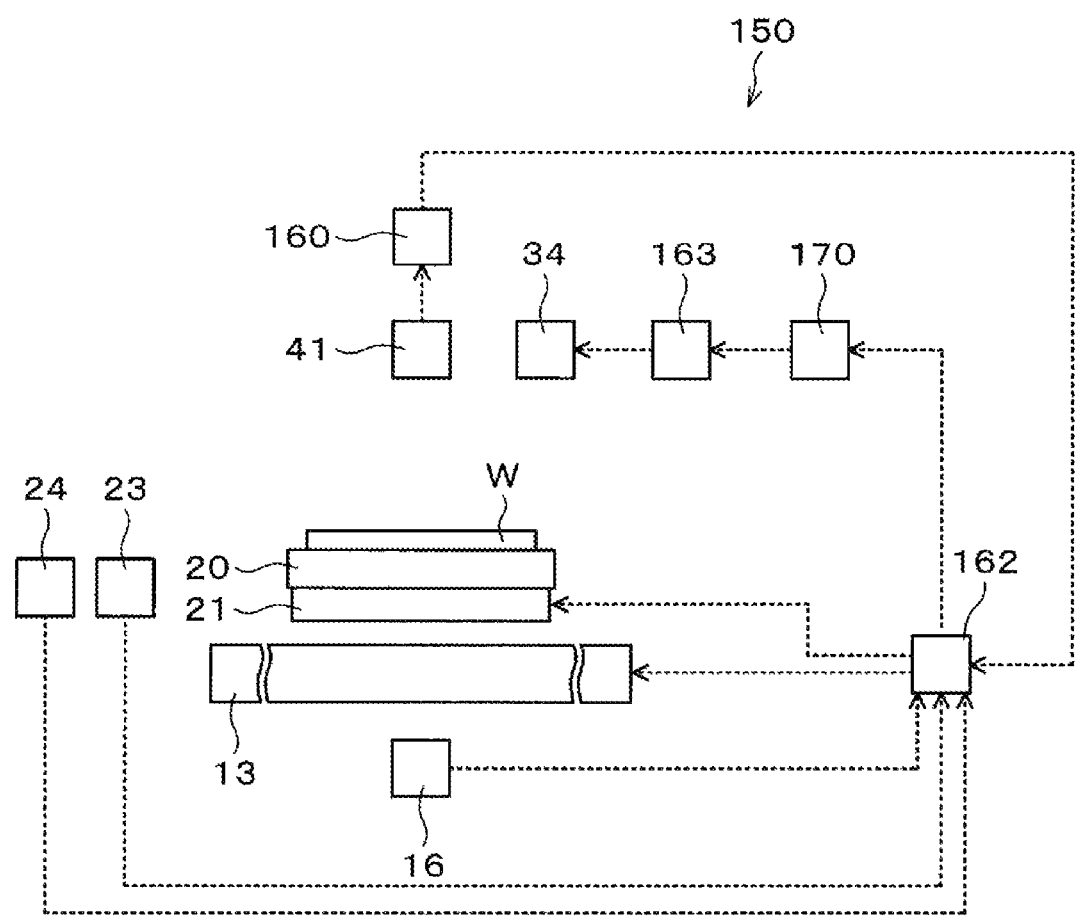
FIG. 11 is an explanatory view schematically illustrating an outline of a configuration of a control unit according to another exemplary embodiment.

In the exemplary embodiments described above, the control unit 150 is configured to use the corrector 161 as illustrated in FIG. 4, but the control unit 150 is not limited thereto. For example, as illustrated in FIG. 11, in addition to the detector 160, the motion controller 162, and the inkjet controller 163, the control unit 150 has an encoder inverter 170 which inverts the pulse signal from the motion controller 162. Further, the corrector 161 is omitted from the control unit 150 in the present exemplary embodiment.

In this case, based on the position of the workpiece W detected by the detector 160, the detector 160 or the motion controller 162 creates a correction table (reference correction table). Further, the motion controller 162 performs the aforementioned steps S1 to S3. That is, based on the pulse signal from the Y-axis linear scale 16 and the signal from the detector 160, the positional correction amount of the workpiece table 20 in the Y-axis direction is calculated using the correction table (reference correction table), and the pulse signal received from the Y-axis linear scale 16 is converted. In addition, the positional correction amounts of the positions of the workpiece table 20 in the X-axis direction and the θ direction are calculated, and the pulse signal from the X-axis linear scale 23 and the pulse signal from the rotary encoder 2 are converted.

Based on the pulse signal (pulse signal after conversion) in the Y-axis direction, the motion controller 162 corrects the position of the Y-axis linear motor 13 by outputting the command signal (pulse train) to the Y-axis linear motor 13. For example, in the case in which a target position is 1,000 mm and the target position deviates by +1 µm (extension side), a command is applied to the Y-axis linear motor 13 to move by 999.999 mm and the position is corrected so that an actual position is 1,000 mm.

Based on the pulse signals (pulse signals after conversion) in the X-axis direction and the θ direction, the motion controller 162 controls the movement of the table movement mechanism 21 by outputting the command signal (pulse train) to the table movement mechanism 21.

Meanwhile, the pulse signal in the Y-axis direction converted by the motion controller 162 is also output to the encoder inverter 170. The encoder inverter 170 inverts the pulse signal from the motion controller 162 using an inversion table and outputs the inverted pulse signal to the inkjet controller 163. That is, the pulse signal from the motion controller 162 corrects the position of the Y-axis linear motor 13, but the pulse signal is inverted into the pulse signal from the Y-axis linear scale 16.

Here, even if the position of the Y-axis linear motor 13 is corrected to the position of 999.999 mm, the ejecting timing of the droplet ejecting head 34 remains at the target position of 1,000 mm. Therefore, in the encoder inverter 170, the pulse signal from the motion controller 162, which indicates 999.999 mm, is inverted into the pulse signal which indicates 1,000 mm. Further, the pulse signal, which indicates 1,000 mm, is output from the encoder inverter 170 to the inkjet controller 163, and the droplet ejecting timing of the droplet ejecting head 34 is controlled.

In this way, the workpiece W placed on the workpiece table 20 is disposed at an appropriate position with respect to the droplet ejecting head 34. Further, even in the present exemplary embodiment, it is possible to obtain an effect similar to that of the exemplary embodiment described above.

In the aforementioned exemplary embodiments, the workpiece table 20 is moved in the Y-axis direction, but the droplet ejecting head 34 may be moved in the Y-axis direction. In this case, the corrector 161 corrects the position of a Y-axis linear motor (not illustrated) which moves the droplet ejecting head 34.

Both of the workpiece table 20 and the droplet ejecting head 34 may be moved in the Y-axis direction. In this case, the corrector 161 corrects the position of the Y-axis linear motor 13 for moving the workpiece table 20 and corrects the position of the Y-axis linear motor (not illustrated) for moving the droplet ejecting head 34.

A line break is performed by moving the workpiece table 20 in the X-axis direction, but the droplet ejecting head 34 may be moved in the X-axis direction. The X-axis linear motor 15 may be used in the case in which the droplet ejecting head 34 is moved in the X-axis direction.

<Application Example of Droplet Ejecting Apparatus>

The droplet ejecting apparatus 1 configured as described above is applied to, for example, a substrate processing system for forming an organic EL layer of an organic light emitting diode which is disclosed in Japanese Patent Application Laid-Open No. 2017-013011. Specifically, the droplet ejecting apparatus 1 is applied to a coating apparatus for applying an organic material for forming a hole injection layer on a glass substrate as the workpiece W, a coating apparatus for applying an organic material for forming a hole transport layer on a glass substrate (hole injection layer), and a coating apparatus for applying an organic material for forming a light emitting layer on a glass substrate (hole transport layer). Further, in the case in which the substrate processing system also forms an electron transport layer and an electron injection layer in addition to forming the hole injection layer, the hole transport layer, and the light emitting layer of the organic light emitting diode, the droplet ejecting apparatus 1 may also be applied to the coating process of forming the electron transport layer and the electron injection layer.

The droplet ejecting apparatus 1 may be applied to form the organic EL layer of the organic light emitting diode as described above, and may be applied to electro-optical devices (flat panel displays (FPD)) such as color filters, liquid crystal display devices, plasma displays (PDP devices), electron emitting devices (FED devices or SED devices), or may be applied to forming metal wiring, lenses, resist, light diffusion bodies, and the like.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A droplet ejecting apparatus comprising:
a workpiece table configured to receive a workpiece thereon;
a droplet ejecting head configured to eject droplets of a functional fluid onto the workpiece placed on the workpiece table so as to draw a pattern on the workpiece;
a linear motor configured to move the workpiece table in a main scanning direction;
a table mover configured to move the workpiece table in a sub-scanning direction orthogonal to the main scanning direction;
a linear scale configured to measure a position of the linear motor in the main scanning direction;
a camera configured to acquire a captured image of the workpiece table or the workpiece placed on the workpiece table; and
a controller that performs an overall control of the droplet ejecting apparatus,
wherein the controller is configured to:
move, by the linear motor, the workpiece table along a first scanning line, a second scanning line, and a third scanning line from among a plurality of scanning lines which extend in the main scanning direction and are set side by side in the sub-scanning direction, the plurality of scanning lines extending along the main scanning direction on a first workpiece,
move, by the table mover, the workpiece table in the sub-scanning direction to perform a line break across the first scanning line and the second scanning line, create a first reference correction table, a second reference correction table, and a third reference correction table for each of the first scanning line, the second scanning line, and the third scanning line, respectively, each reference correction table indicating a correlation between the position of the linear motor in the main scanning direction measured by the linear scale and a positional correction amount of the workpiece table in the main scanning direction, move, by the table mover, the workpiece table along a fourth scanning line and a fifth scanning line from among the plurality of scanning lines, create a fourth correction table for the fourth scanning line by interpolating the first reference correction table and the second reference correction table, and create a fifth correction table for the fifth scanning line by interpolating the first reference correction table and the third reference correction table.

2. The droplet ejecting apparatus of claim 1, wherein the controller is configured to use a position of a reference mark formed in advance on the workpiece or the workpiece table when detecting a position of the workpiece or a position of the workpiece table using the camera.

3. The droplet ejecting apparatus of claim 2, wherein a plurality of reference marks are formed side by side in the main scanning direction, and one or more reference marks are formed side by side in the sub-scanning direction.

4. The droplet ejecting apparatus of claim 1, wherein the camera is configured to be movable in the sub-scanning direction, and the controller is configured to detect the position of the first workpiece or the position of the workpiece table based on the captured image acquired by the camera.

5. The droplet ejecting apparatus of claim 1, wherein the controller is further configured to eject droplets of the functional fluid onto the workpiece as the workpiece table is moved in the scanning direction along the first scanning line, the second scanning line, and the third scanning line.

6. The droplet ejecting apparatus of claim 1, wherein the controller is further configured to control the linear motor and the droplet ejecting head based on the positional correction amount.

7. A droplet ejecting method comprising:
providing a workpiece table configured to receive a workpiece thereon;
providing a droplet ejecting head configured to eject droplets of a functional fluid onto the workpiece placed on the workpiece table so as to draw a pattern on the workpiece;
providing a linear motor configured to move the workpiece table in a main scanning direction;
providing a table mover configured to move the workpiece table in a sub-scanning direction orthogonal to the main scanning direction;
providing a linear scale configured to measure a position of the linear motor in the main scanning direction;
providing a camera configured to acquire a captured image of the workpiece table or the workpiece placed on the workpiece table; and
providing a controller; wherein the controller is configured to:
control movement of the workpiece table by the linear motor along a first scanning line, a second scanning line, and a third scanning line from among a plurality of scanning lines which extend in the main scanning direction and are set side by side in the sub-scanning direction orthogonal to the main scanning direction while ejecting droplets of the functional liquid from the droplet ejecting head onto a first workpiece so as to draw the pattern, the plurality of scanning lines extending along the main scanning direction on the first workpiece, control movement of the workpiece table by the table mover in the sub-scanning direction to perform a line break across the first scanning line and the second scanning line, create a first reference correction table, a second reference correction table, and a third reference correction table for each of the first scanning line, the second scanning line, and the third scanning line, respectively, each reference correction table indicating a correlation between the position of the linear motor in the main scanning direction measured by the linear scale and a positional correction amount of the workpiece table in the main scanning direction, control movement of the workpiece table, by the table mover, along a fourth scanning line and a fifth scanning line from among the plurality of scanning lines, create a fourth correction table for the fourth scanning line by interpolating the first reference correction table and the second reference correction table, and create a fifth correction table for the fifth scanning line by interpolating the first reference correction table and the third reference correction table;

moving, by the linear motor, the workpiece table along the first scanning line, the second scanning line, and the third scanning line from among the plurality of scanning lines which extend in the main scanning direction and are set side by side in the sub-scanning direction orthogonal to the main scanning direction while ejecting droplets of the functional liquid from the droplet ejecting head onto the first workpiece received on the workpiece table so as to draw the pattern, the plurality of scanning lines extending along the main scanning direction on the first workpiece;

moving, by the table mover, the workpiece table in the sub-scanning direction to perform the line break across the first scanning line and the second scanning line;

creating the first reference correction table, the second reference correction table, and the third reference correction table for each of the first scanning line, the second scanning line, and the third scanning line, respectively, each reference correction table indicating the correlation between the position of the linear motor in the main scanning direction measured by the linear scale and the positional correction amount of the workpiece table in the main scanning direction, creating the fourth correction table for the fourth scanning line by interpolating the first reference correction table and the second reference correction table, and creating the fifth correction table for the fifth scanning line by interpolating the first reference correction table and the third reference correction table.

8. The droplet ejecting method of claim 7, wherein a position of a reference mark formed in advance on the workpiece or the workpiece table is used to detect a position of the first workpiece or the position of the workpiece table using the camera.

9. The droplet ejecting method of claim 8, wherein a plurality of reference marks are formed side by side in the main scanning direction, and one or more reference marks are formed side by side in the sub-scanning direction.

10. The droplet ejecting method of claim 7, wherein a position of the workpiece or a position of the workpiece table is detected based on a captured image acquired by the camera, and the camera is configured to be movable in the sub-scanning direction.

* * * * *